United States Patent [19]

McGann

[11] 4,100,504

[45] Jul. 11, 1978

[54] BAND REJECTION FILTER HAVING INTEGRATED IMPEDANCE INVERTER-TUNE CAVITY CONFIGURATION

[75] Inventor: William E. McGann, Satellite Beach, Fla.

[73] Assignee: Harris Corporation, Cleveland, Ohio

[21] Appl. No.: 808,364

[22] Filed: Jun. 20, 1977

[51] Int. Cl.² ............................................. H03B 21/02
[52] U.S. Cl. ...................................... 331/39; 325/477; 331/43; 333/73 C
[58] Field of Search .......................... 331/43, 39, 101; 325/477, 489; 343/180; 333/73 C, 73 W, 82 B Primary Examiner—John Kominski
Attorney, Agent, or Firm—Craig & Antonelli

[57] ABSTRACT

For eliminating an unwanted leaking local oscillator signal from the output of a double-balanced mixer circuit in a microwave frequency up-converter, a band rejection filter formed of series connected impedance inverter elements and a plurality of tuned cavity resonators is provided. The cavity resonators are integrally formed by the cylindrical walls of an aluminum housing, the top portion of which is formed of a plated printed circuit board. That face of the printed circuit board which faces the cylindrical cavities of the resonators is plated with copper to form the upper surface of each resonator. The other side of the printed circuit board is selectively plated with copper layers which extend through the board to the lower layer to provide an extensive ground plane. The impedance inverter elements themselves are formed of quarter-wavelength coaxial cable sections and are directly connected between the tuning stubs of the cavity resonators and have their outer conductor jackets directly soldered to the ground plane. The compactness of the band rejection filter permits it to be disposed in a housing arrangement between the printed circuit cards upon which the active components of the radio hardware are disposed. Losses through lengthy terminal connections are avoided, as a result.

11 Claims, 5 Drawing Figures

BAND REJECTION FILTER HAVING INTEGRATED IMPEDANCE INVERTER-TUNE CAVITY CONFIGURATION

FIELD OF THE INVENTION

The present invention relates to a band rejection filter, particularly one having an integrated impedance inverter-tuned cavity configuration suitable for use in an up-converter for a single channel per carrier communication system.

BACKGROUND OF THE INVENTION

A problem which frequently arises within an I. F. mixer stage of a microwave signal transmission system is the degree of undesirable leakage of the local oscillator signal through the mixer. This problem is especially paramount in present day technology where bandwidth expansion is desired; yet, because of communication system restraints, such as modem design, the frequencies employed limit the degree of refinement for elimination of undesirable signals in systems heretofore developed.

Attempts to remove the local oscillator signal at the output of a mixer have included the use of shorting stubs connected between the center lead of the usual 50 ohm mixer output cable and ground. Unfortunately, the $Q_u$ of such tuning stubs is on an order of 300, so that the maximum degree of attenuation of the local oscillator signal has been 10-15dB.

Another problem in such systems has been the reduction in the size or volume of the radio hardware, a problem which is significantly acute when such systems are employed in an airborne environment. Of course, it goes without saying that as the degree of integration of the radio components is increased, interconnection between components can be shortened and losses throughout the system are reduced.

SUMMARY OF THE INVENTION

In accordance with the present invention, there is provided a band rejection filter for a microwave transmission system which is capable of effectively eliminating the local oscillator signal component at the output of a mixer and which provides a considerable reduction in the amount of packaging required for the radio hardware. For this purpose, at the output of an up-converting double-balanced mixer circuit, there is provided a band rejection filter configuration composed of a series of impedance inverters at the junctions of which TEM mode cavity resonators are disposed. The housing configuration for the impedance inverters and cavity resonators is such that a printed circuit board, provided with an extensive ground plane, forms one end of the cavity of each TEM mode resonator. The resonator elements are arranged side-by-side and the impedance inverters are disposed on the side of the printed circuit board opposite to that facing the cavity resonator tuning stubs. This band rejection filter package is compactly positioned between the sets of printed circuit boards upon which the other elements of the radio electronics hardware, such as the double-balanced mixer circuits, are mounted. The compactness of the arrangement lends to a reduction in losses through the system; yet, the manner in which the cavity resonators are mounted permits the cavities to be of the appropriate diameter so that the Q of the filter is of a sufficiently large magnitude whereby the filter effectively rejects the local oscillator signal which leaks through the up-converter mixer circuitry.

DETAILED DESCRIPTION

Figure 1:
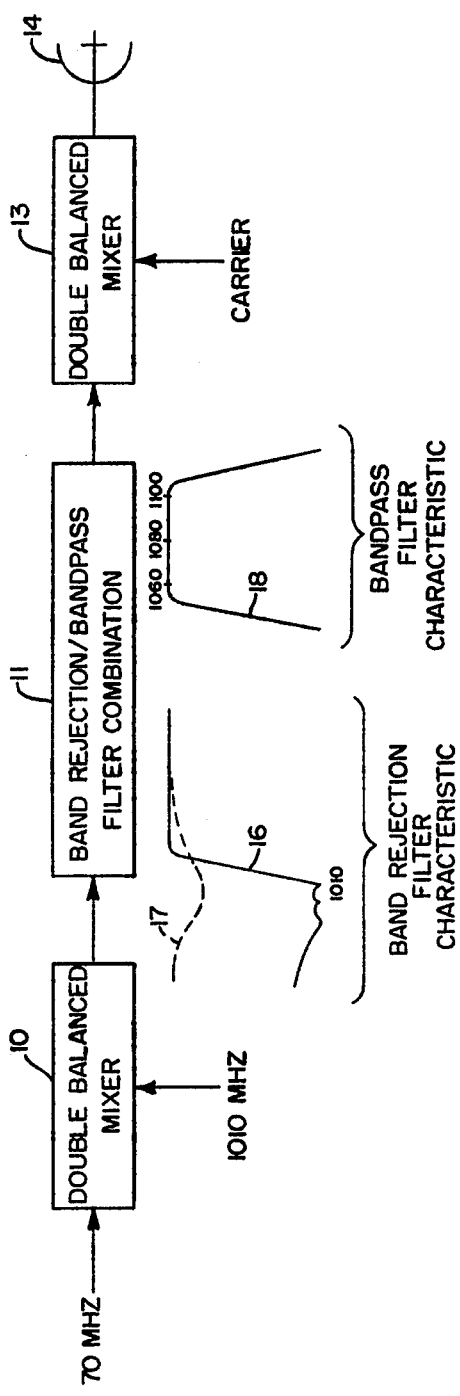
FIG. 1 is a block diagram schematic illustration of the transmitter circuitry configuration in which the band rejection filter of the present invention is employed, with accompanying component response curves.

A simplified schematic illustration of components employed in the up-converter transmitter circuitry in which the band rejection filter of the present invention is employed is shown in FIG. 1. It should be noted that while the particular filter configuration of the present invention is employed at the output of a mixer for removing the unwanted local oscillator signal which lies adjacent the sum-frequency component of the combination signal output of the mixer, it may also be used to eliminate the local oscillator signal wherein the derived output is the difference-frequency component of the mixer. The input information signal is supplied at an IF frequency of 70MHz, to be up-converted to a center frequency of 1080MHz. For this purpose, a conventional double-balanced mixer 10 combines the two input signals and up-converts the IF frequency to 1080MHz. Unfortunately, there is a 35dB leakage of the local oscillator (1010MHz) signal at the output of the mixer which must be removed. In the spectrum characteristic this signal appears as a spike at the local oscillator frequency which is extremely close to the up-converted center frequency of 1080MHz. As was pointed out above, prior art attempts to reduce the spike have included the use of shorting stubs which, at best, have been able to provide only a small degree of attenuation, as illustrated by broken lines 17, depicted directly beneath the band rejection/bandpass filter block 11 in FIG. 1.

In accordance with the present invention, the band rejection filter is capable of providing a rejection on the order of 95dB, so that there is an effective rejection or elimination of the local oscillator signal. The spectrum characteristic of the band rejection filter is shown by the solid line 16, depicted beneath the band rejection filter block 11 in FIG. 1.

As a result of this rejection, the local oscillator signal does not present a problem and maximum use can be made of the bandpass filter characteristic provided by filter combination 11, whose spectrum characteristic is shown by solid line 18, directly beneath the righthand portion of block 11. In the exemplary embodiment depicted, the BPF has a 40MHz bandwidth at a center frequency of 1080MHz feeding the double-balanced mixer for the carrier signal 13, to be supplied to antenna 14 for transmission. Typically, the signal is a single channel per carrier signal useful for present day satellite communication techniques.

Figure 2:
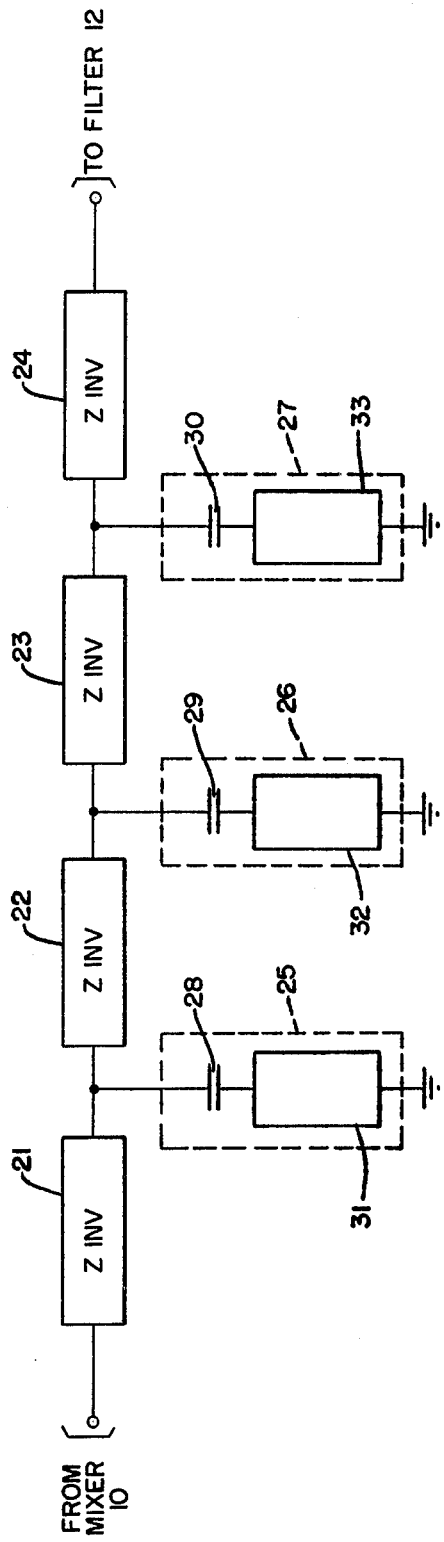
FIG. 2 is a schematic illustration of the circuit configuration of the band rejection filter in accordance with the present invention.

To effectively remove the unwanted local oscillator signal which leaks through the double-balanced mixer 10, shown in FIG. 1, the present invention employs a combination of an impedance inverter series circuit and a plurality of TEM mode cavity resonators connected thereto in the manner shown in FIG. 2. In the exemplary embodiment depicted in the Figure, there are four impedance inverters 21, 22, 23, and 24 at the common connections of which respective cavity resonators 25, 26, and 27 are connected. The other terminal of each cavity resonator is connected to ground. Each cavity resonator includes a cavity with a stub 31, 32, and 33, respectively, together with precision microware tuner elements 28, 29, and 30, the spacing between which is adjustable for tuning the cavities to the desired frequency.

Figure 3:
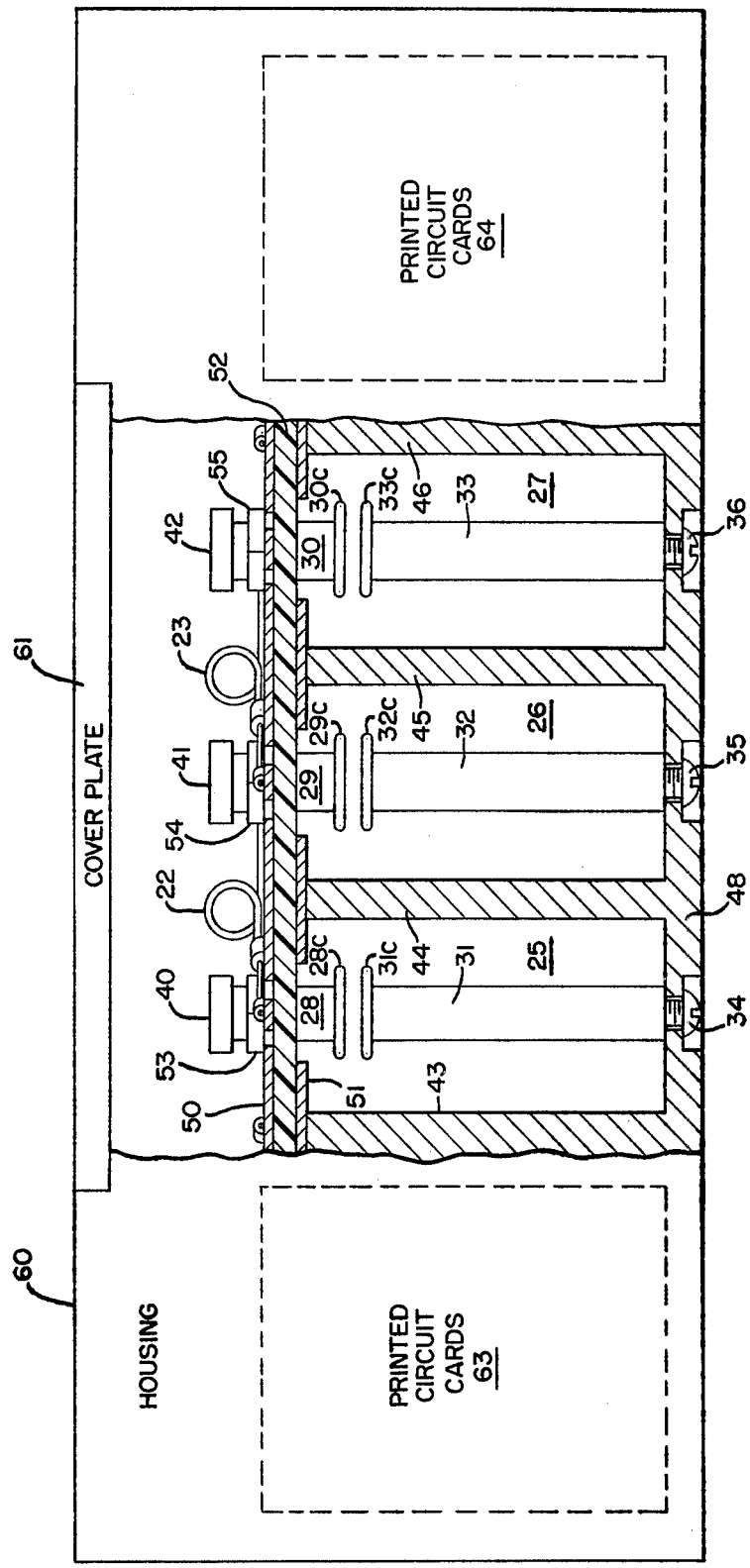
FIG. 3 is a side view of the physical configuration of the band rejection filter and the overall housing assembly for the radio components in which the present invention is employed.
Figure 4:
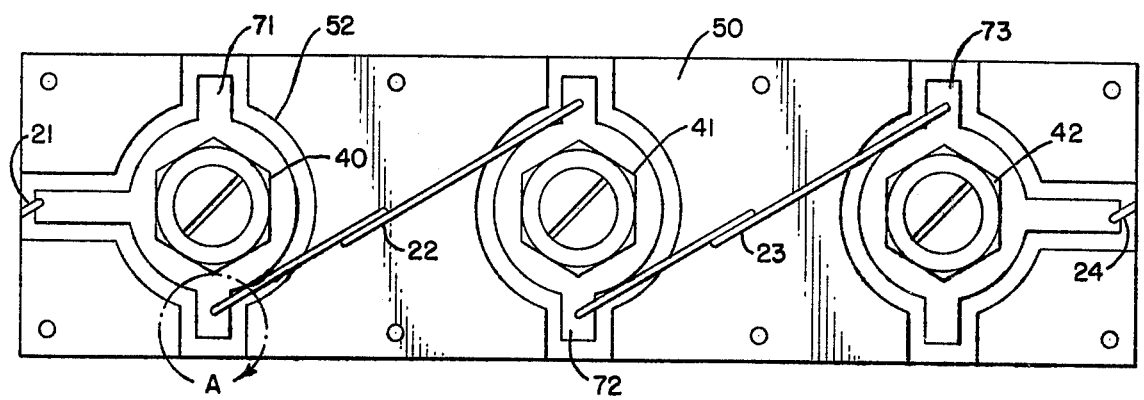
FIG. 4 is a partial top view of the band rejection filter of the present invention.
Figure 5:
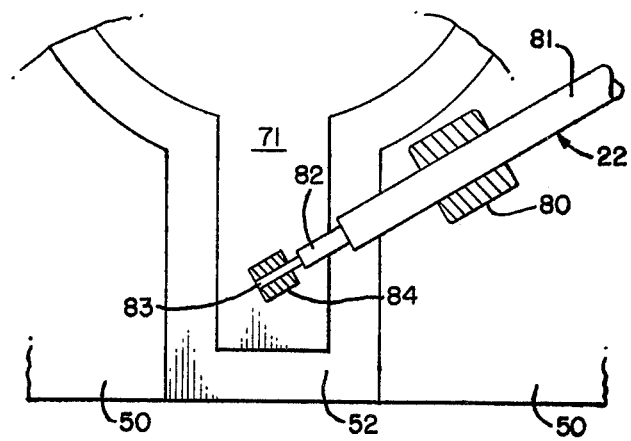
FIG. 5 is an enlarged illustration of a portion of FIG. 4 designated by broken lines A.

A detailed illustration of the physical arrangement of the components of the band rejection filter is presented in FIGS. 3 through 5.

Referring now to FIG. 3, the various components of the radio are housed in a housing 60 which contains most of the active elements mounted on a plurality of printed circuit cards 63 and 64, stacked in parallel with one another and in parallel with the sheet of drawings, as shown. The housing may be formed of a lightweight good conductive metal such as aluminum, having a base portion 48 between which extend cylindrically shaped walls 43, 44, 45, and 46 which form the walls of the respective TEM mode resonator cavities. In the exemplary embodiment described, for providing a Q on the order of 1,500, the diameter of the walls is ¾ of an inch. If a larger Q and a greater rejection is desired, the cavity diameter is increased.

The respective resonator cavities include aluminum rods 31, 32, and 33 respectively held in place by screws 34, 35, and 36. At the top of each rod is an aluminum cap 31c, 32c, and 33c which is capacitively coupled to a respective cap 28c, ; 29c, and 30c of precision tuning elements 28, 29, and 30. The tuning elements may be Johanson precision microwave tuners having adjustment screws 40, 41, and 42 with anti-backlash properties, and respective lock nuts 53, 54, and 55, as shown. To provide temperature compensation, caps 28c, 29c, and 30c are made of a metal having a coefficient of thermal expansion different from that of aluminum and such that for the geometry employed, the frequency is maintained constant irrespective of changes in temperature. Brass has been found to be a suitable metal for this purpose.

The upper end of each cavity is formed of a copper plated printed circuit board 52, the copper plating being formed on both sides of the printed circuit board by etching respective layers 51 and 50 in accordance with a prescribed pattern to permit insertion of the precision tuner through the printed circuit board and a contiguous connection of the upper copper plating to the lower copper plating so that an effective ground plane is provided. The material of the printed circuit board has necessary rigidity and strength and may be made of G10 fiberglass.

Mounted atop the printed circuit board are impedance inverter elements 21 through 24. Elements 22 and 23 are connected between the upper copper plated layers 71, 72, and 73 which are insulated and spaced apart from the remainder of layer 50 as shown in the top view of the filter illustrated in FIG. 4. Each impedance inverter is formed of a quarter wavelength section of copper jacketed coaxial cable, the center conductor of which is soldered to the copper layer which is connected to the tuning stub of one resonator in the manner shown in FIG. 5.

Thus, impedance inverter 22 is soldered at one end thereof to the copper layer 71 of cavity 45 by providing a solder layer 84 which adheres to the copper layer 71 and the center conductor 83. Surrounding the center layer 83 is an insulator jacket 82 and surrounding this insulator jacket is a copper outer layer 81 which, itself, is soldered to the ground plane 50 by a solder layer 80. Each quarter wavelength section of coaxial cable is appropriately looped on a mandrel and fits directly upon the ground plane to not only provide the necessary impedance inverter parameter but to substantially eliminate losses therethrough between cavities.

FIG. 4 also shows portions of the coaxial conductors of which impedance inverters 21 and 24 are made. These inverters extend directly to the printed circuit cards, so that like the manner in which impedance inverters 22 and 23 are mounted directly atop the printed circuit board 52, impedance inverters 21 and 22 provide a direct connection between the band rejection filter and the remainder of the radio components to which the filter is connected without substantial conductor losses.

As will be appreciated from the illustration of the housing arrangement shown in FIG. 3, in accordance with the present invention, there is provided an extremely compact band rejection filter package for the up-converter portion of the radio circuit. A cover plate 61 is mounted atop the housing 60 in the manner shown to complete the unit. Thus, not only does the present invention provide a significantly improved degree of rejection of the unwanted local oscillator signal leaking from the up-converter mixer circuitry, but the actual physical configuration of the components making up the band rejection filter affords a significant increase in circuit packaging integration and further provides the advantage that the same materials employed for the printed circuit card components may be used for constructing the cavity resonator components.

While I have shown and described one embodiment in accordance with the present invention it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

I claim:

1. A band rejection filter arrangement comprising:
   an input terminal to which an input signal having a prescribed frequency component to be effectively rejected is to be coupled;
   an output terminal from which an output signal absent said prescribed frequency component is to be derived;
   a plurality of impedance inverter elements connected in series between said input and output terminals; and
   respective tunable resonator cavity elements connected between the junctions of commonly connected impedance inverter elements and a reference potential terminal; wherein
   one end of each of said resonator cavity elements is formed of an insulator board having first conductive material disposed on the side thereof facing each cavity; and wherein on the side of said insulator board facing away from each cavity there is provided a second conductive material, which is connected to said first conductive material, and upon which ones of said impedance inverter elements are affixed.

2. A band rejection filter arrangement according to claim 1, wherein each of said sides of said insulator board is provided with a conductive layer, portions of which extend through apertures in said board so that the conductive layers on each side of said board are electrically contiguous with each other, and wherein each impedance inverter element is formed of a quarter-wavelength section of coaxial cable having an outer conductor affixed to the conductive layer on the side of said insulator board facing away from each resonator cavity.

3. A band rejection filter arrangement according to claim 2, wherein each resonator cavity element includes a tuning stub portion extending through said insulator board and having a conductive layer disposed on said board and being connected thereto, but insulatingly spaced apart from the conductive layer to which the outer conductor of the coaxial cable of each impedance inverter element is connected, the center conductor of the coaxial cable of each respective impedance inverter element being connected to the conductive layer which is contiguous with a resonator cavity tuning stub portion.

4. A band rejection filter arrangement according to claim 3, wherein each resonator cavity element has a cylindrical cavity wall integrally formed with the cylindrical cavity wall of an adjacent resonator cavity element.

5. A band rejection filter arrangement according to claim 4, wherein each resonator cavity element includes a central tuning rod spaced apart from the tuning stub thereof, said rod and stub having respective cap portions made of conductive materials having different coefficients of thermal expansion for maintaining the tuned frequency of the resonator constant, irrespective of temperature changes.

6. In a microwave frequency converter-filter circuit having a mixer circuit which combines a local oscillator frequency signal with an input frequency signal and produces an output frequency signal as an arithmetic combination of the frequencies of the local oscillator and the input signal and which contains as an unwanted component said load oscillator frequency signal, and a bandpass filter circuit having a center frequency at said arithmetic combination frequency for selectively filtering the output of said mixer within a selected passband the improvement comprising a band rejection filter arrangement coupled to said bandpass filter circuit for removing said unwanted local oscillator frequency signal component from the output of said mixer circuit, said band rejection filter arrangement comprising:

an input terminal to which an input signal having a prescribed frequency component to be effectively rejected is to be coupled;

an output terminal from which an output signal absent said prescribed frequency component is to be derived;

a plurality of impedance inverter elements connected in series between said input and output terminals; and respective tunable resonator cavity elements connected between the junctions of commonly connected impedance inverter elements and a reference potential terminal; wherein one end of each of said resonator cavity elements is formed of an insulator board having first conductive material disposed on the side thereof facing each cavity; and wherein on the side of said insulator board facing away from each cavity there is provided a second conductive material, which is connected to said first conductive material, and upon which ones of said impedance inverter elements are affixed.

7. The improvement according to claim 6, wherein each of said sides of said insulator board is provided with a conductive layer, portions of which extend through apertures in said board so that the conductive layers on each side of said board are electrically contiguous with each other, and wherein each impedance inverter element is formed of a quarter-wavelength section of coaxial cable having an outer conductor affixed to the conductive layer on the side of said insulator board facing away from each resonator cavity.

8. The improvement according to claim 7, wherein each resonator cavity element includes a tuning stub portion extending through said insulator board and having a conductive layer disposed on said board and being connected thereto, but insulatingly spaced apart from the conductive layer to which the outer conductor of the coaxial cable of each impedance inverter element is connected, the center conductor of the coaxial cable of each respective impedance inverter element being connected to the conductive layer which is contiguous with a resonator cavity tuning stub portion.

9. The improvement according to claim 8, wherein each resonator cavity element has a cylindrical cavity wall integrally formed with the cylindrical cavity wall of an adjacent resonator cavity element.

10. The improvement according to claim 9, wherein each resonator cavity element includes a central tuning rod spaced apart from the tuning sub thereof, said rod and stub having respective cap portions made of conductive materials having different coefficients of thermal expansion for maintaining the tuned frequency of the resonator constant, irrespective of temperature changes.

11. The improvement according to claim 10, wherein the components of which said mixer circuit is comprised are mounted in printed circuit card configurations, disposed in a housing, said housing having support and terminal connection members for printed circuit cards at opposite ends thereof with said band rejection filter arrangement being supported in said housing between said printed circuit cards, thereby permitting minimum distance terminal connections between circuit components on said cards and the input and output terminals of said band rejection filter arrangement.

* * * * *